| 
US009722012B1

(12) United States Patent
Pathmanathan et al.

(10) Patent No.: US 9,722,012 B1
(45) Date of Patent: Aug. 1, 2017

(54) CIRCUITS AND METHODS PROVIDING MUTUAL CAPACITANCE IN VERTICAL ELECTRICAL CONNECTIONS

(71) Applicant: QUALCOMM Incorporated, San Diego, CA (US)

(72) Inventors: Priyatharshan Pathmanathan, Wake Forest, NC (US); Devarshi Patel, Cary, NC (US); Dennis Allen Northgrave, Fuquay Varina, NC (US); Kyle Roberts, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/255,412

(22) Filed: Sep. 2, 2016

(51) Int. Cl.
*G11C 11/40* (2006.01)
*G11C 11/24* (2006.01)
*H01L 49/02* (2006.01)
*H01L 23/498* (2006.01)
*H01L 27/108* (2006.01)
*G11C 11/401* (2006.01)

(52) U.S. Cl.
CPC ............ *H01L 28/40* (2013.01); *G11C 11/401* (2013.01); *H01L 23/49811* (2013.01); *H01L 23/49822* (2013.01); *H01L 23/49827* (2013.01); *H01L 23/49838* (2013.01); *H01L 27/108* (2013.01)

(58) Field of Classification Search
CPC ..... G11C 11/401; G11C 11/24; G11C 11/565; H01L 23/49811; H01L 23/49822; H01L 23/49827; H01L 23/49838; H01L 27/108; H01L 28/40

USPC ...................................... 365/66, 63, 102, 149
See application file for complete search history.

(56) References Cited

U.S. PATENT DOCUMENTS 8,263,454 B2 * 9/2012 Lee ...................... H01L 27/105
257/E29.342
9,105,635 B2   8/2015 Altunyurt et al.
9,240,621 B2   1/2016 Abbott et al.
(Continued)

FOREIGN PATENT DOCUMENTS

WO    WO-2014099775 A1    6/2014

OTHER PUBLICATIONS

Eged B., et al., "Reduction of Far-End Crosstalk on Coupled Microstrip PCB Interconnect," Manuscript for the IEEE Instrumentation and Measurement Technology Conference, May 10-12, 1994, 8 pages.

*Primary Examiner* — Tan T. Nguyen
(74) *Attorney, Agent, or Firm* — Haynes and Boone, LLP (36340)

(57) ABSTRACT

An electrical device including a structure having a plurality of dielectric layers, the structure further having a plurality of vertical electrical connections extending from a top layer of the dielectric layers to a bottom layer of the dielectric layers, a first vertical electrical connection of the plurality of vertical electrical connections including a first capacitive structure that extends in a plane perpendicular to a vertical dimension of the vertical electrical connection, wherein the first capacitive structure is disposed on a first dielectric layer of the plurality of dielectric layers, wherein the first dielectric layer is below the top layer, and a second vertical electrical connection of the plurality of vertical electrical connections including a second capacitive structure extending in the plane and disposed on the first dielectric layer.

16 Claims, 6 Drawing Sheets

(56) References Cited

U.S. PATENT DOCUMENTS

2001/0038115 A1* 11/2001 Amanuma ........ H01L 21/76838
  257/303
2014/0268614 A1   9/2014 Zhang et al.
2015/0085458 A1   3/2015 Enriquez et al.
2016/0094272 A1   3/2016 Ye et al.

* cited by examiner

CIRCUITS AND METHODS PROVIDING MUTUAL CAPACITANCE IN VERTICAL ELECTRICAL CONNECTIONS

TECHNICAL FIELD

The present application relates, generally, to crosstalk reduction, and more specifically to circuits and methods using mutual capacitance to reduce or minimize crosstalk.

BACKGROUND

A conventional computing device may include a chip disposed in a package, where the package is mounted upon a printed circuit board (PCB). In one example, the chip includes a multi-core processor, which is disposed within a chip package. The chip package includes socket pins, which are coupled with electrical contacts on the printed circuit board. Traces on the printed circuit board provide electrical communication between the multi-core processor and random-access memory chips.

The chip/package/PCB structure includes vertical electrical connections. For instance, metal vias within the chip itself allow for communication between different metal layers. Similarly, vias within the printed circuit board allow for communication between different layers of the PCB.

In high speed signaling systems such as double data rate fourth-generation synchronous dynamic random-access memory (DDR4), crosstalk from adjacent signal (aggressor) transmission paths on a system degrades the performance of victim paths. Increasing pin density of sockets, connectors and associated vias are the main sources of crosstalk. Crosstalk induced in vertical sections of the channel reaches the receiving agents as far end crosstalk and degrades the performance. Accordingly, there is a need in the art to reduce or eliminate far end crosstalk.

SUMMARY

According to one embodiment, an electrical device includes a structure having a plurality of dielectric layers, the structure further having a plurality of vertical electrical connections extending from a top layer of the dielectric layers to a bottom layer of the dielectric layers; a first vertical electrical connection of the plurality of vertical electrical connections including a first capacitive structure that extends in a plane perpendicular to a vertical dimension of the vertical electrical connection, wherein the first capacitive structure is disposed on a first dielectric layer of the plurality of dielectric layers, wherein the first dielectric layer is below the top layer; and a second vertical electrical connection of the plurality of vertical electrical connections including a second capacitive structure extending in the plane and disposed on the first dielectric layer.

According to another embodiment, a method includes: conducting an electrical signal in a first vertical electrical connection; and during conducting the electrical signal, storing energy in an electrical field by mutual capacitance between the first vertical electrical connection and a second vertical electrical connection, wherein the first vertical electrical connection and the second vertical electrical connection are each implemented in a multi-layer dielectric structure, further wherein the first vertical electrical connection includes a first capacitive structure extending in a plane perpendicular to a vertical dimension of the first vertical electrical connection, further wherein the second vertical electrical connection includes a second capacitive structure extending in the plane, and wherein the first capacitive structure and second capacitive structure are located within a same layer of the multi-layer dielectric structure.

According to another embodiment, an apparatus includes: a structure having a plurality of dielectric layers; first vertical means for conducting an electrical signal between ones of the dielectric layers including a first mutual capacitance structure that extends in a plane perpendicular to a vertical dimension of the first vertical means, wherein the first mutual capacitance structure is disposed on a first dielectric layer of the plurality of dielectric layers, wherein the first dielectric layer is below the top layer; and second vertical means for conducting an electrical signal between ones of the dielectric layers including a second mutual capacitance structure extending in the plane and disposed on the first dielectric layer.

DETAILED DESCRIPTION

Figure 1:
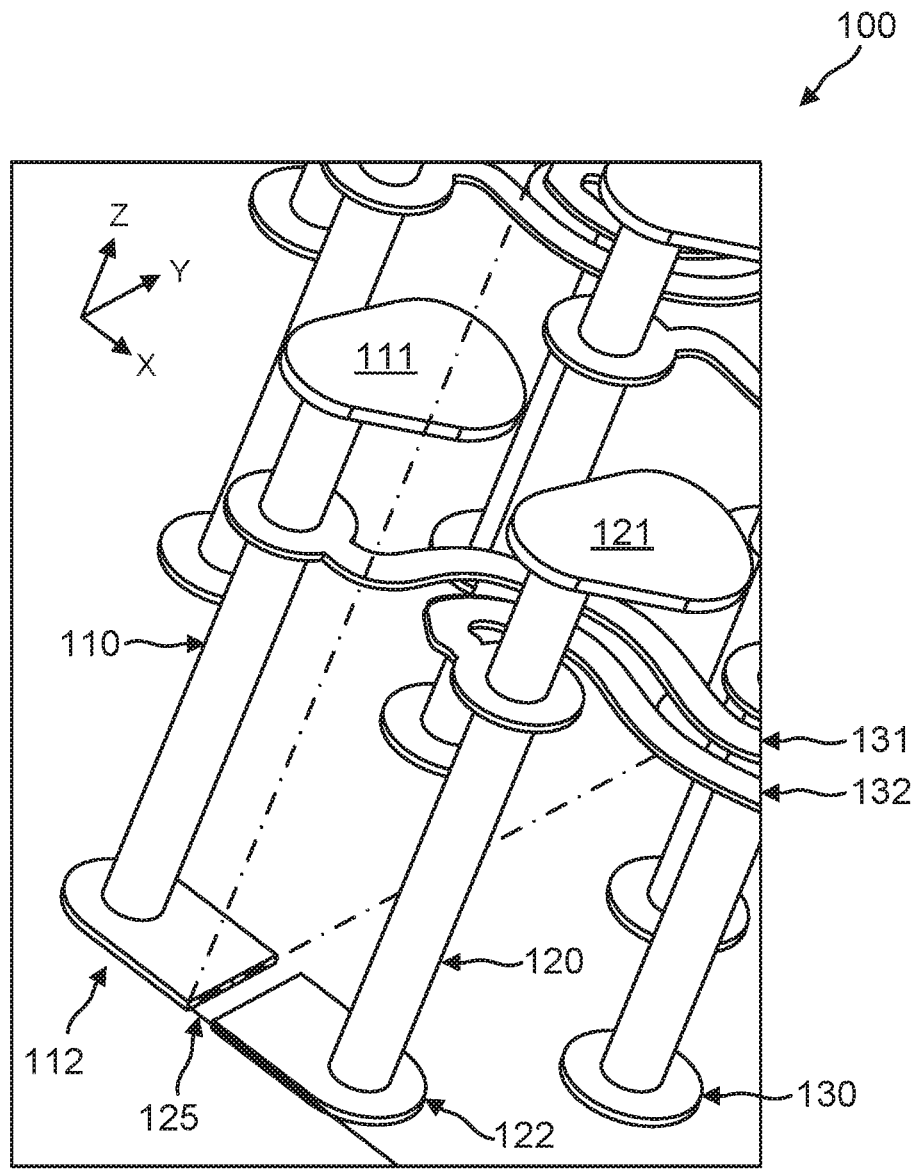
FIG. 1 is an illustration of an example electrical device according to one embodiment.

Various embodiments include systems and methods to reduce far end crosstalk by addressing mutual capacitance of vertical electrical connections, such as vias. Vias may include capacitive structures that serve to increase mutual capacitance among adjacent vias, thereby reducing far end crosstalk voltage levels.

Far end crosstalk may be modeled according to Equation 1 below:

$$V_{Fext} = \frac{t_{pd}}{2}\left(\frac{C_m}{C_s} - \frac{L_m}{L_s}\right)\frac{\partial V_{agg}}{\partial t} \qquad \text{Equation 1}$$

In Equation 1, $V_{Fext}$ is a magnitude of far end crosstalk, $C_m$ is mutual capacitance between two structures, $L_m$ is mutual inductance between those two structures, and $C_s$ and $L_s$ are self-capacitance and self-inductance respectively. $V_{agg}$ is a voltage of an aggressor signal, and $t_{pd}$ is a propagation delay of the signal. In vertical signal paths, mutual inductance $L_m$ tends to dominate and thus, causing negative far end crosstalk. Further, mutual inductance $L_m$, self-capacitance $C_s$, and self-inductance $L_s$ tend to be uncontrollable in tighter vertical sections. Thus, to reduce or cancel negative far end crosstalk, mutual capacitance $C_m$ can be increased in order to reduce the value of $(C_m/C_s - L_m/L_s)$.

In one embodiment, an electrical device includes a system on chip (SOC) disposed within a chip package, wherein the chip package is disposed upon a printed circuit board. The printed circuit board is made of a plurality of dielectric layers, and conductive features, such as traces and contacts, are disposed on various ones of the dielectric layers. Continuing with this embodiment, electrical signals to and from the SOC are conducted through the chip package and to the printed circuit board by virtue of socket pins. The socket pins are in electrical communication with conductive contacts built on a top layer of the printed circuit board. Some of the electrical contacts are further in electrical communication with vias within the PCB.

Further in this example, the PCB includes electrical traces from ones of the vias across a horizontal distance to a second set of vias. The second set of vias are in electrical communication with contacts on the top layer of the PCB and with a memory chip or a connector which holds a dual in-line memory module (DIMM) with memory chip on it. As the SOC reads and writes data to and from the memory chip, it conducts signals to ones of its vias, and from the vias to the traces and to the second set of vias and to the memory chip. The memory chip also includes driver circuits that drive signals to and from the SOC along the same or similar routes. An example of a memory chip includes a double data rate fourth-generation synchronous dynamic random-access memory (DDR4), although the scope of embodiments is not limited to any particular memory technology.

In this example, the memory signals are single-ended, rather than differential. Accordingly, this example embodiment includes capacitive structures to mitigate far end crosstalk. For instance, focusing on a subset of two adjacent vias within the PCB, each of the adjacent vias may include capacitive structures within a layer of the PCB below the top layer. The capacitive structures are formed in a plane perpendicular to the vertical dimensions of the vias, and the capacitive structures extend toward each other in their own length dimensions. While the top layer of the PCB may be used for electrical contacts, other layers of the PCB may be available for hosting the capacitive structures.

The shapes of the capacitive structures increase mutual capacitance of the two adjacent vias, thereby mitigating far end crosstalk according to Equation 1. In various embodiments, the shapes of the structures may be chosen through simulation or experimentation to achieve a desired level of mutual capacitance at the particular signal frequencies. Furthermore, while the example above focuses on PCB vias, the concept of including capacitive structures on vias may be applied to vias within the SOC or vias within the chip package. In fact, such capacitive structures may be applied to any appropriate vertical electrical connection.

Other embodiments include methods of use for electrical devices having a structure similar to the above, where conduction of the signals stores energy within an electric field between capacitive structures, thereby reducing far end crosstalk.

FIG. 1 is a simplified isometric diagram illustrating an example electrical device 100 in which various embodiments may be implemented. For ease of illustration, FIG. 1 includes a legend illustrating the X, Y, and Z axes. The Z axis defines the vertical dimension of the vias 110 and 120. The vias 110 and 120 are implemented in a PCB in this example; however, the PCB itself is not illustrated to avoid obscuring the view of the vias 110 and 120. Nonetheless, one of skilled in the art should readily appreciate that the PCB includes a plurality of layers of dielectric material, where each of the layers extends in a plane defined by the X and Y axes. An example of a PCB includes dielectric layers of FR-4 glass epoxy or other suitable material. The vias 110, 120 and other conductive and capacitive structures may be made of copper and/or other appropriate conductor.

Via 110 has a pad 111 to provide electrical coupling with a package socket pin (not shown). Pad 111 is disposed on a top layer of the PCB. Via 120 has a similar pad 121, also disposed on the top layer of the PCB. Capacitive structures 112, 122 are provided in the embodiment of FIG. 1 in order to increase mutual capacitance. Specifically, the surface areas of capacitive structures 112, 122 are increased compared with via pad 130. In this example capacitive structures 112, 122 are coplanar and are disposed on a single layer of the PCB structure—in this example, the bottom layer of the PCB structure. Also, capacitive structures 112, 122 each have a major dimension in the x-axis and extend toward each other in the x-axis, but do not make electrical contact with each other. Capacitive structures 112, 122 do not provide direct electrical contact to another structure, but rather are electrically isolated from structures other than their respective vias 110, 120.

As shown in FIG. 1, the shapes of capacitive structures 112, 122 is partially semicircular with elongated rectangular portions extending along the x-axis toward each other. However, the scope of embodiments may include any appropriate shape to achieve a desired value for mutual capacitance.

Referring back to Equation 1 above, far end crosstalk is a function of the signal rise time. In the present example, signal rise time is approximately 50-100 ps, and operating voltage is 400-800 mV. Each of the vias 110, 120 are spaced apart by about 1 mm center-to-center, and the size of the gap 125 is approximately 100 μm. The capacitive structures 112, 122 form a co-planar parallel plate capacitor that stores energy in an electric field as the vias 110, 120 conduct the signals. Examples of signals include data signals and also clock signals. An PCB includes 18 layers of FR-4 material stacked on top of each other in the Z axis. The specific values given above are for example only, and it is understood that various embodiments may be designed as appropriate to achieve a desired value for mutual capacitance.

Vias 110, 120 are in electrical communication with horizontal traces 131, 132 respectively. In the present example, electrical contact pads 111, 121 receive electrical signals from an SOC (not shown) and propagate those signals along horizontal traces 131, 132 to a second set of vias (not shown) associated with a memory chip. In this example, capacitive structures 112, 122 are disposed in a layer of the PCB that is different from the layer used for the horizontal traces 131, 132 and different from the layer used for contact pads 111, 121. Various embodiments may dispose capacitive structures 112, 122 in any appropriate layer. Furthermore, while the example of FIG. 1 shows capacitive structures associated with only two vias 110, 120, it is understood that various embodiments may implement capacitive structures with any appropriate vias and with any appropriate number of vias.

Figure 2:
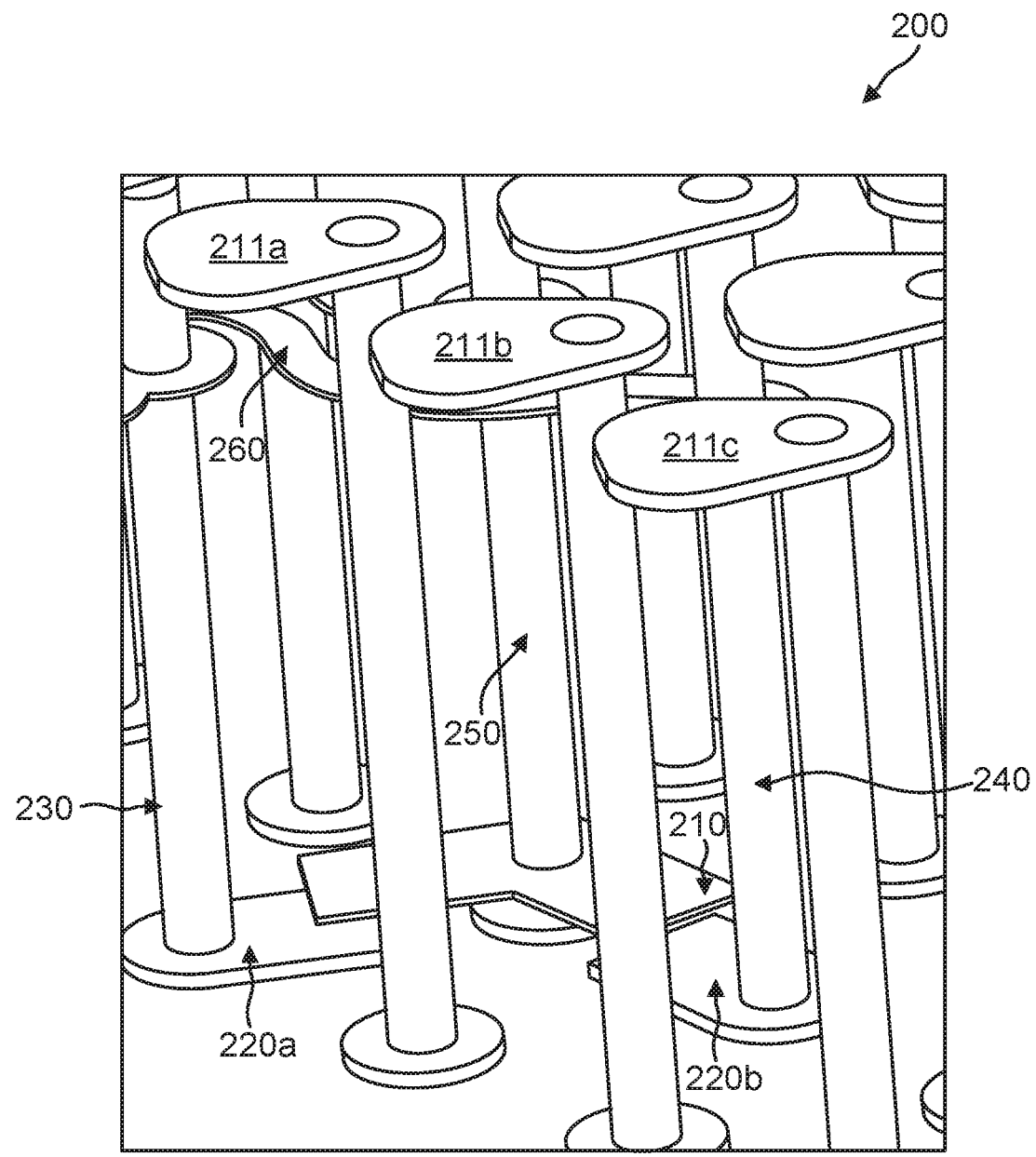
FIG. 2 is an illustration of an example electrical device according to one embodiment.

The scope of embodiments includes other shapes and arrangements. For instance, FIG. 2 is an isometric view of electrical device 200, adapted according to one embodiment. Electrical device 200 includes capacitive structures 210 and 220, which are disposed in different layers of the PCB. In this example, capacitive structures 220 are similar in shape to capacitive structures 112, 122 of the example of FIG. 1.

In the current example, capacitive structures 220 are formed in a bottom-most layer of the PCB, whereas capacitive structure 210 is formed in a layer above that bottom-most layer. Capacitive structures 220, in their respective major dimensions within an X-Y plane, extend toward adjacent via 250. Capacitive structure 210 is formed as plates that extend orthogonally from the via 250 and toward adjacent vias 230, 240 in a different X-Y plane.

Capacitive structures 210 and 220 also work to increase mutual capacitance and thereby decrease inductive crosstalk. For instance, the capacitive structure 220a associated with via 230 increases mutual capacitance with via 250 by forming a parallel plate capacitor with the arm of structure 210 that extends toward via 230. The capacitive structure 220b associated with via 240 increases mutual capacitance with via 250 by forming a parallel plate capacitor with the arm of structure 210 that extends toward via 240.

Similar to the embodiment of FIG. 1 above, vias 230-250 may be made of copper or other appropriate conductor and have a vertical dimension along the z-axis, whereas the layers of the PCB (not shown) are in different X-Y planes stacked along the z-axis. Horizontal trace 260 provide electrical coupling between via 230 and another via (not shown). Contact pads 211 are similar to pads 111, 121 of the embodiment of FIG. 1.

Figure 3:
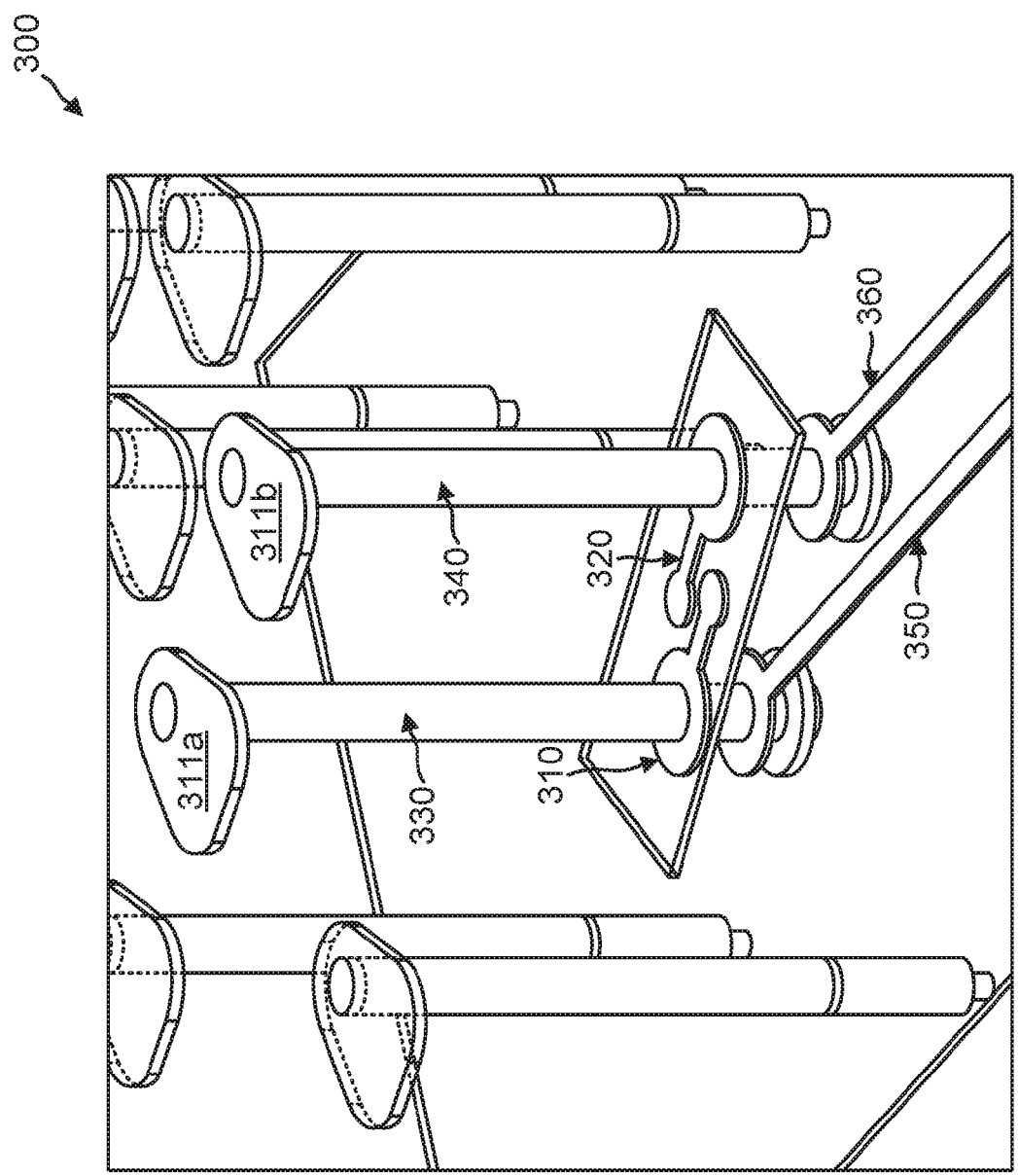
FIG. 3 is an illustration of an example electrical device according to one embodiment.

Yet another shape and arrangement is shown in the embodiment of FIG. 3. FIG. 3 is an isometric illustration of an example electrical device 300, adapted according to one embodiment. The electrical device 300 includes vias 330 and 340. Vias 330 and 340 include contact pads 311, similar to contact pads 111 and 121 of FIG. 1. Also, horizontal traces 350 and 360 conduct signals from vias 330 and 340 respectively to a second subset of vias (not shown). Once again, the vertical dimensions of vias 330 and 340 is along the z-axis, and the layers of the PCB (not shown) are formed in X-Y planes stacked in the z-axis.

Capacitive structures 310 and 320 are formed as circular pads having short traces extending toward the adjacent via. In this example, structure 310 is formed in a different layer than is structure 320. However, the scope of embodiments may include structures 310 and 320 being formed in a same layer. Once again, structures 310 and 320 operate to increase mutual capacitance by storing energy in an electric field between the horizontal traces of structures 310 and 320.

Furthermore, capacitive structures 310 and 320 are formed in different layers than are horizontal traces 350 and 360 and contact pads 311. In other words, capacitive structures 310 and 320 are formed in a layer below the topmost layer of the PCB and those layers are not used for conducting electrical signals, at least with respect to vias 330 and 340.

In the embodiments shown above in FIGS. 1-3, the amount of mutual capacitance provided by the capacitive structures can be adjusted in the design phase by either increasing or decreasing a surface area of a respective capacitive structure. As a general rule, a greater surface area of a structure leads to a greater mutual capacitance provided by that structure. Additionally, the amount of mutual capacitance provided by the capacitive structures in FIGS. 1-3 may be adjusted in the design phase by increasing or decreasing a distance between capacitive structures, so that a shorter distance generally increases mutual capacitance. Also, while the embodiments shown above are described with respect to PCBs, the scope of embodiments may include vertical electrical connectors implemented elsewhere, such as in a semiconductor chip itself, in the package, or at any other appropriate place.

Figure 4:
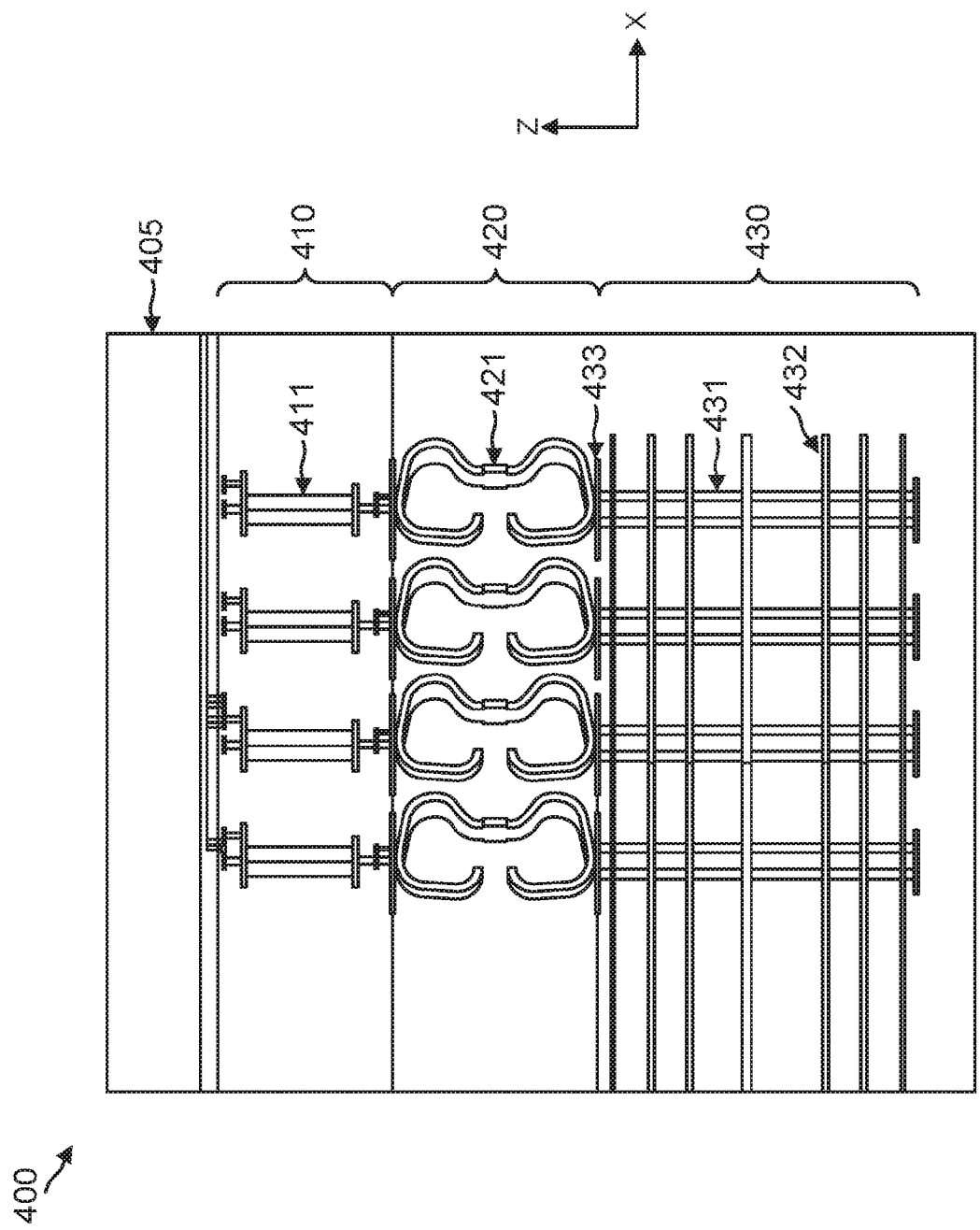
FIG. 4 is an illustration of an example internal architecture of the electrical devices of FIGS. 1-3, according to one embodiment.

FIG. 4 is an illustration of an example device stack 400, adapted according to one embodiment. Device stack 400 is an example of an environment in which the structures described above with respect to FIGS. 1-3 may be implemented. Semiconductor die 405 may include a SOC or other processing device or may include a memory chip. Although not shown herein, it is understood that semiconductor die 405 may include vias vertically connecting one or more metal layers within the die itself.

Semiconductor die 405 is disposed on a semiconductor die package 410. Semiconductor die package 410 provides mechanical support and electrical connections to the die 405. Examples of materials of package 410 may include plastic, ceramic, or a dielectric such as FR-4 arranged in multiple layers. FIG. 4 shows multiple vias, exemplified by via 411. Via 411 provides electrical coupling between one or more contacts (not shown) on the underside of die 405 and the socket pins within the socket 420. Pin 421 is an example of a socket pin of socket 420. In some examples, the socket 420 is part of the package, whereas in other embodiments it may be a physically separate component. In any event, the package 410 and the socket 420 provide electrical coupling between the semiconductor die 405 and the printed circuit board 430.

The socket 420 is mounted to the printed circuit board 430 so that the socket pins, such as socket pin 421, are coupled to contact pads, such as contact pad 433. Examples of contact pads in the embodiments of FIGS. 1-3 include those contact pads 111, 121, 211 and 311. FIG. 4 shows multiple vias, of which via 431 is an example. Furthermore, PCB 430 includes multiple metal layers, exemplified by metal layer 432. Each of the metal layers is disposed upon a respective dielectric layer, where PCB 430 is made up of a plurality of dielectric layers. The vias of PCB 430 allow for electrical signals to be passed from one layer of the PCB to another layer of the PCB, for example, by using horizontal traces.

The illustration of FIG. 4 is a cutaway in the Z-X plane, so that the metal layers are shown edge-on. It is within these metal layers that the capacitive structures may be implemented. It is understood that in the edge-on view provided by FIG. 4, capacitive structures are not necessarily discernible from horizontal traces, though the illustrations of FIGS. 1-3 provide illustrations of how various examples may be implemented within the metal layers of PCB 430.

As noted above, the examples of FIGS. 1-3 describe vias and capacitive structures within the metal layers of the PCB, such as PCB 430. However, other embodiments may implement similar capacitive structures in the vias (e.g., 411) of the package 410 or vias within the semiconductor die 405. Specifically, using simulation or experimentation, a designer may iteratively change shapes of capacitive structures and distances between capacitive structures to achieve a desired level of mutual capacitance. The shapes and distances described above with respect to FIGS. 1-3 are examples for specific structural dimensions and signal rise times, and those shapes and distances may be modified as appropriate to benefit different structures and different rise times.

Figure 5:
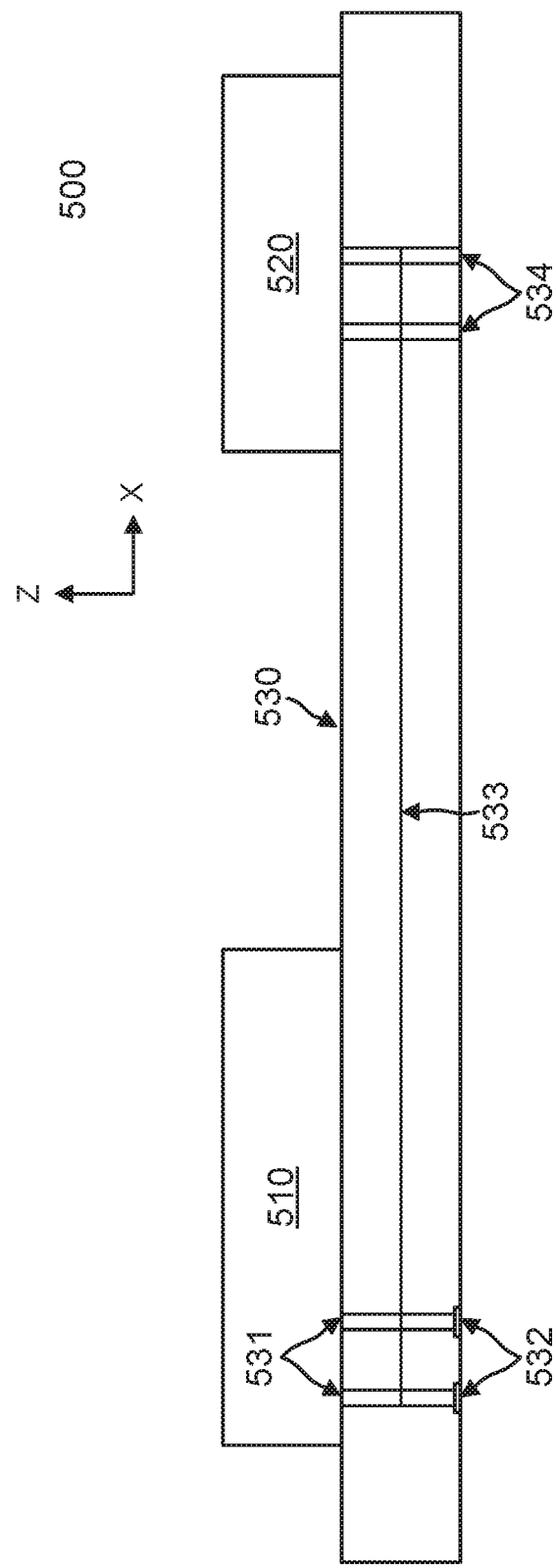
FIG. 5 is an illustration of example internal components of a computing device, including the features of the devices of FIGS. 1-3, according to one embodiment.

FIG. 5 is an illustration of internal components 500 of a computing device, such as a smart phone, tablet computer, or a server mainboard, adapted according to one embodiment. Chip package 510 includes an SOC, and chip package 510 is mounted to PCB 530. Similarly, chip package 520 includes a memory chip, and chip package 520 is also mounted to PCB 530. The SOC (not shown) is in electrical communication with vertical electrical connectors of the chip package 510 and with the PCB 530 as explained above with respect to FIG. 4. In a similar manner, a memory chip (not shown) is in electrical communication with vertical electrical connectors of the chip package 520 and with the PCB 530.

PCB 530 includes vias 531, which are in electrical communication with chip package 510. PCB 530 also includes vias 534, which are in electrical communication with chip package 520. Vias 531 are electrically coupled to vias 534 by horizontal traces 533. FIG. 5 provides an end-on view, so that horizontal traces 533 are represented by a single line, but it is understood that vias 531 may be connected to vias 534 using multiple and separate horizontal traces. In one example, the SOC and the memory chip communicate by virtue of the vias 531, the horizontal traces 533, and the vias 534 according to protocols associated with DDR4, fifth-generation synchronous dynamic random-access memory (DDR5), or other appropriate technique.

Further in this example, vias 531 include capacitive structures 532, which are similar to capacitive structures 112 and 122 of FIG. 1. However, it is understood that the capacitive structures of other embodiments, such as those of FIGS. 2 and 3, may be implemented in PCB 530 additionally or alternatively.

Although not shown in FIG. 5, it is understood that the computing device may include other components, such as a battery, other printed circuit boards, other integrated circuit chips and the chip packages, and the like. The battery, the printed circuit boards, and the integrated circuit chips are disposed within the computing device so that they are enclosed within a physical housing of the computing device.

Various embodiments may provide one or more advantages over conventional systems. For instance, some conventional systems add structures to the horizontal traces in order to reduce far end crosstalk. However, embodiments described herein may be more space efficient by using layers of a printed circuit board, package, or semiconductor die that are not used for conducting electrical signals by the particular vias. For instance, in the embodiments of FIGS. 1-3, the capacitive structures include shapes of conductive material that are disposed on layers at which the vias are not using for horizontal traces. Such additional conductive material may be added to a design at little or no additional cost.

The capacitive structures themselves do not make direct electrical contact to other structures and may therefore take any of a variety of arbitrary shapes that may be optimized for achieving a particular value of mutual capacitance. Furthermore, the shapes and designs of the capacitive structures may be efficiently determined using simulation software in an iterative manner, including adjusting and simulating repeatedly until acceptable parameters are found.

Figure 6:
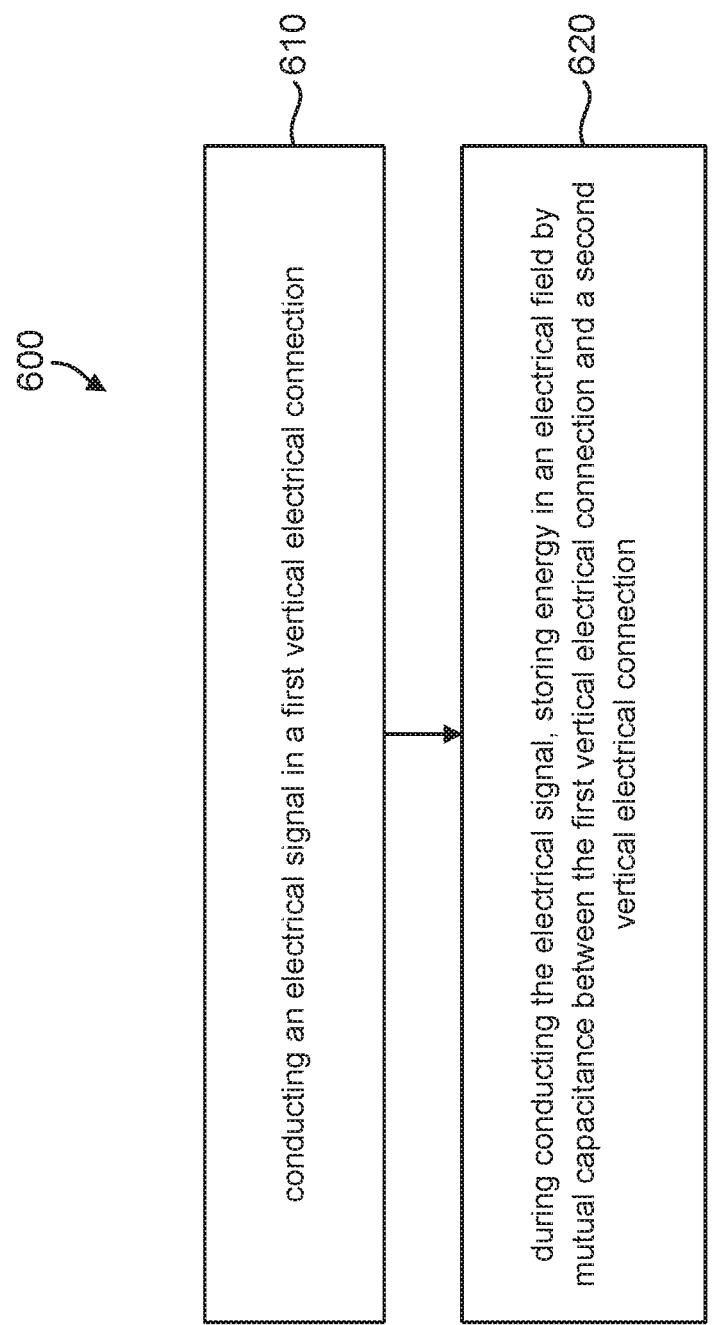
FIG. 6 is an illustration of a flow diagram of an example method of conducting signals while reducing far end crosstalk, according to one embodiment.

A flow diagram of an example method 600 of transmitting an electrical signal is illustrated in FIG. 6. In one example, method 600 is performed during use of an electrical device, such as those illustrated in FIGS. 1-5.

At action 610, the electrical device conducts an electrical signal in a first vertical electrical connection. An example of an electrical signal may include a data signal or a clock signal. The electrical signal includes some portions that are at one voltage in some portions that are at another voltage, thereby representing digital ones and zeros. Whereas a clock signal may be periodic and alternating, a data signal may include multiple instances of the same values in a row. Further in this example, the electrical signal is single-ended rather than differential, thereby making it more prone to crosstalk phenomena. However, far end crosstalk may be mitigated using the structures and techniques described herein.

An example of action 610 includes conducting an electrical signal from one of the vias 531 to another one of the vias 534 (or vice versa) over horizontal traces 533 and FIG. 5. The via itself provides for communication of the electrical signal from one layer in the structure (e.g., PCB, package, a semiconductor die) to another layer in the structure. For instance, in the example of FIG. 5, the electrical signal is communicated to via 531 at a top layer of the PCB 530 and is conducted along the horizontal trace 533 at a lower layer of the PCB 530. Conduction of the signal however may create crosstalk between the respective vias 531.

At action 620, during conducting the electrical signal, the first vertical electrical connection and a second vertical electrical connection store energy in an electrical field by mutual capacitance. For example, in FIG. 5 vias 531 include capacitive structures 532. The capacitive structures 532 add mutual capacitance between the two particular vias 531. According to the designs shown in FIGS. 1-3, the capacitive structures may increase the mutual capacitance so as to reduce or cancel far end crosstalk in accordance with Equation 1.

As the computing device operates during normal use, it may conduct millions or billions of digital bits per second from one chip to another chip by use of the vertical electrical connections and horizontal traces. Accordingly, a computing device may perform actions 610 and 620 repeatedly and at a frequency associated with the clock frequency of the chips. An example of chips include a processing chip, such as an SOC, and a memory chip communicating using DDR4 or other techniques.

The scope of embodiments is not limited to the specific method shown in FIG. 6. Other embodiments may add, omit, rearrange, or modify one or more actions. For instance, method 600 is not intended to imply that actions 610 and 620 are performed in series; rather, it is understood that they occur at substantially the same time in operating examples.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. An electrical device comprising:
    a structure having a plurality of dielectric layers, the structure further having a plurality of vertical electrical connections extending from a top layer of the dielectric layers to a bottom layer of the dielectric layers;
    a first vertical electrical connection of the plurality of vertical electrical connections including a first capacitive structure that extends in a plane perpendicular to a vertical dimension of the first vertical electrical connection, wherein the first capacitive structure is disposed on a first dielectric layer of the plurality of dielectric layers, wherein the first dielectric layer is below the top layer; and
    a second vertical electrical connection of the plurality of vertical electrical connections including a second capacitive structure extending in the plane and disposed on the first dielectric layer, wherein the first capacitive structure is in an elongated shape, wherein a length dimension of the first capacitive structure extends toward the second capacitive structure.

2. The electrical device of claim 1, wherein the first dielectric layer is between the top layer and the bottom layer.

3. The electrical device of claim 1, wherein the first capacitive structure and the second capacitive structure are disposed on the bottom layer.

4. The electrical device of claim 1, wherein the second capacitive structure is also in the elongated shape, wherein a length dimension of the second capacitive structure extends toward the first capacitive structure.

5. The electrical device of claim 1, wherein the structure having the plurality of dielectric layers comprises a semiconductor die package.

6. The electrical device of claim 1, wherein the structure having a plurality of dielectric layers comprises a semiconductor die.

7. An electrical device comprising:
a structure having a plurality of dielectric layers, the structure further having a plurality of vertical electrical connections extending from a top layer of the dielectric layers to a bottom layer of the dielectric layers;
a first vertical electrical connection of the plurality of vertical electrical connections including a first capacitive structure that extends in a plane perpendicular to a vertical dimension of the first vertical electrical connection, wherein the first capacitive structure is disposed on a first dielectric layer of the plurality of dielectric layers, wherein the first dielectric layer is below the top layer; and
a second vertical electrical connection of the plurality of vertical electrical connections including a second capacitive structure extending in the plane and disposed on the first dielectric layer, wherein the structure having the plurality of dielectric layers comprises a Printed Circuit Board (PCB);
a plurality of socket pins in communication with a top surface of the PCB and in electrical communication with the first vertical electrical connection and the second vertical electrical connection;
a semiconductor die package disposed on top of the plurality of socket pins and having a first set of electrical contacts in electrical communication with the plurality of socket pins; and
a semiconductor die mounted to the semiconductor die package and having a second set of electrical contacts in electrical communication with the semiconductor die package.

8. A method comprising:
conducting an electrical signal in a first vertical electrical connection; and
during conducting the electrical signal, storing energy in an electrical field by mutual capacitance between the first vertical electrical connection and a second vertical electrical connection, wherein the first vertical electrical connection and the second vertical electrical connection are each implemented in a multi-layer dielectric structure, further wherein the first vertical electrical connection includes a first capacitive structure extending in a plane perpendicular to a vertical dimension of the first vertical electrical connection, further wherein the second vertical electrical connection includes a second capacitive structure extending in the plane, and wherein the first capacitive structure and second capacitive structure are located within a same layer of the multi-layer dielectric structure.

9. The method of claim 8, wherein conducting an electrical signal comprises conducting the electrical signal to or from a memory device.

10. The method of claim 9, wherein storing energy in the electric field by mutual capacitance comprises storing energy in an electrical field at least in part by the first capacitive structure and the second capacitive structure.

11. The method of claim 10, wherein conducting the electrical signal in the first vertical electrical connection comprises:
conducting the electrical signal in a horizontal electrical trace from the first vertical electrical connection to a third vertical electrical connection in communication with the horizontal electrical trace, wherein the horizontal electrical trace is in a different layer of the multi-layer dielectric structure than the first capacitive structure and the second capacitive structure.

12. The method of claim 11, wherein conducting the electrical signal in the first vertical electrical connection comprises:
conducting the electrical signal between layers of the multi-layer dielectric structure.

13. An apparatus comprising:
a structure having a plurality of dielectric layers;
first vertical means for conducting an electrical signal between ones of the dielectric layers including a first mutual capacitance structure that extends in a plane perpendicular to a vertical dimension of the first vertical means, wherein the first mutual capacitance structure is disposed on a first dielectric layer of the plurality of dielectric layers, wherein the first dielectric layer is below a top layer; and
second vertical means for conducting an electrical signal between ones of the dielectric layers including a second mutual capacitance structure extending in the plane and disposed on the first dielectric layer, wherein the first mutual capacitance structure comprises an elongated shape, wherein a length dimension of the first mutual capacitance structure extends toward the second mutual capacitance structure.

14. The apparatus of claim 13, wherein the first mutual capacitance structure and the second mutual capacitance structure are disposed on a bottom layer of the plurality of dielectric layers.

15. The apparatus of claim 13, wherein the structure having the plurality of dielectric layers comprises a semiconductor die package.

16. An apparatus comprising:
a structure having a plurality of dielectric layers;
first vertical means for conducting an electrical signal between ones of the dielectric layers including a first mutual capacitance structure that extends in a plane perpendicular to a vertical dimension of the first vertical means, wherein the first mutual capacitance structure is disposed on a first dielectric layer of the plurality of dielectric layers, wherein the first dielectric layer is below a top layer;
second vertical means for conducting an electrical signal between ones of the dielectric layers including a second mutual capacitance structure extending in the plane and disposed on the first dielectric layer, wherein the structure having the plurality of dielectric layers comprises a Printed Circuit Board (PCB);
a plurality of socket pins in communication with a top surface of the PCB and in electrical communication with the first vertical means and the second vertical means;
a semiconductor die package disposed on top of the plurality of socket pins and having a first set of electrical contacts in electrical communication with the plurality of socket pins; and
a semiconductor die mounted to the semiconductor die package and having a second set of electrical contacts in electrical communication with the semiconductor die package.

* * * * *